US 6,469,362 B2

(12) United States Patent
Wong et al.

(10) Patent No.: US 6,469,362 B2
(45) Date of Patent: *Oct. 22, 2002

(54) HIGH-GAIN PNP BIPOLAR JUNCTION TRANSISTOR IN A CMOS DEVICE AND METHOD FOR FORMING THE SAME

(75) Inventors: Shyh-Chyi Wong; Wen-Ying Wen, both of Hsinchu (TW)

(73) Assignee: Winbond Electronics Corp. (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/505,148

(22) Filed: Feb. 15, 2000

(65) Prior Publication Data

US 2002/0036333 A1 Mar. 28, 2002

(51) Int. Cl.[7] .............................................. H01L 29/00
(52) U.S. Cl. .................. 257/511; 257/512; 257/517; 257/370
(58) Field of Search ................. 257/511, 512, 257/517, 370, 119, 658, 103, 510, 141, 197, 423, 525–526

(56) References Cited

U.S. PATENT DOCUMENTS

| 4,311,532 A | * | 1/1982 | Taylor | 257/370 |
| 4,642,667 A | * | 2/1987 | Magee | 357/35 |
| 4,760,433 A | * | 7/1988 | Young | 357/42 |
| 5,319,235 A | * | 6/1994 | Kihara | 257/370 |

OTHER PUBLICATIONS

Yan et al., "Gate–Controlled Lateral PNP BJT: Characteristics, Modeling and Circuit Applications," IEEE Transactions on Electron Devices (Jan. 1997) 44:118–128.

* cited by examiner

Primary Examiner—Olik Chaudhuri
Assistant Examiner—Nathan W. Ha
(74) Attorney, Agent, or Firm—Finnegan, Henderson, Farabow, Garrett & Dunner, L.L.P.

(57) ABSTRACT

An integrated circuit device includes a semiconductor substrate, an NMOS, a PMOS contiguous with the NMOS, and a composite pnp bipolar junction transistor contiguous with the NMOS. The composite pnp bipolar junction transistor includes a lateral npn bipolar junction transistor having a first current gain, and a lateral pnp bipolar junction transistor having a second current gain, wherein the current gain of the composite pnp bipolar junction transistor equals the first current gain multiplied by the second current gain.

15 Claims, 10 Drawing Sheets

HIGH-GAIN PNP BIPOLAR JUNCTION TRANSISTOR IN A CMOS DEVICE AND METHOD FOR FORMING THE SAME

BACKGROUND OF THE INVENTION

1. Field of the Invention

This invention pertains in general to a bipolar junction transistor and, more particularly, to a high-gain pnp bipolar junction transistor in a CMOS circuit.

2. Description of the Related Art

Bipolar junction transistors ("BJTs") are important in a number of applications in a CMOS device, which, by definition, includes at least one p-channel and one n-channel metal-oxide semiconductor field-effect transistor ("MOSFET"). BJTs generally exhibit higher gain, higher frequency performance and lower noise compared to MOSFETs. The gain ($\beta$) of a BJT is defined as the ratio of collector current $I_C$ over base current $I_B$, and is inversely proportional to well-depth and well concentration. As a result, BJTs often exhibit lower than preferred gain when incorporated in a conventional CMOS circuit because of deep well-depth and high well concentration.

SUMMARY OF THE INVENTION

Accordingly, the present invention is directed to a high-gain pnp BJT in a CMOS device that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof, as well as the appended drawing.

To achieve these and other advantages, and in accordance with the purpose of the invention as embodied and broadly described, there is provided an integrated circuit device that includes a semiconductor substrate, a first n-well in the substrate, a first p-well contiguous with the first n-well in the substrate, and a second n-well contiguous with the first p-well. The second n-well includes a second p-well having a first n-type region and a second n-type region, wherein the first and the second n-type regions respectively define emitter and collector regions of a first BJT, a first p-type region spaced apart from the second n-type region, wherein the first p-type region and the second p-well respectively define emitter and collector regions of a second BJT, and a third n-type region spaced apart from the first p-type region.

In one aspect of the invention, the first n-type region is a collector of a composite pnp BJT.

In another aspect of the invention, the second p-well and the first p-type region comprise emitter of a composite pnp BJT.

In yet another aspect of the invention, the third n-type region is a base of a composite pnp BJT.

In still another aspect of the invention, the second p-well comprises an npn BJT.

In another aspect of the invention, the second p-well, the first p-type region, and the third n-type region comprise a pnp BJT.

Also in accordance with the invention, there is provided an integrated circuit device that includes a semiconductor substrate, an NMOS formed in the substrate, a PMOS contiguous with the NMOS and formed in the substrate, and a composite pnp bipolar junction transistor contiguous with the NMOS and formed in the substrate, wherein the composite pnp bipolar junction transistor includes a lateral npn bipolar junction transistor having first and second spaced-apart n-type regions, and a lateral pnp bipolar junction transistor including the second spaced-apart n-type region, a first p-type spaced-apart region and a third n-type region, wherein the first p-type spaced-apart region and the third n-type region are separated by a shallow trench isolation.

In one aspect of the invention, a gain of the composite pnp bipolar junction transistor equals gain of the lateral npn bipolar junction transistor multiplied by a gain of the lateral pnp bipolar junction transistor.

Further in accordance with the present invention, there is provided an integrated circuit device that includes a semiconductor substrate, an NMOS formed in the substrate, a PMOS contiguous with the NMOS and formed in the substrate, and a composite pnp bipolar junction transistor contiguous with the NMOS and formed in SON the substrate, wherein the composite pnp bipolar junction transistor includes a lateral npn bipolar junction transistor having a first current gain, and a lateral pnp bipolar junction transistor having a second current gain, and wherein a current gain of the composite pnp bipolar junction transistor equals the first current gain multiplied by the second current gain.

Additionally in accordance with the present invention, there is provided a method for forming a composite pnp BJT in a CMOS device having a substrate including an n-well region. The method includes providing a first photoresist over the substrate, patterning and defining the photoresist to expose a portion above the n-well region, implanting the n-well region with a dopant to form a shallow p-well region, and removing the photoresist. The method also includes the steps of implanting a first dose of dopant to form lightly-doped n-type spaced-apart regions, implanting a second dose of dopant to form a lightly-doped p-type spaced-apart region, forming a gate structure including a gate and gate oxide, implanting a third dose of dopant into the lightly-doped spaced-apart n-type regions to form heavily-doped n-type regions wherein the third dose of dopant is more concentrated than the first dose of dopant, and implanting a fourth dose of dopant into the lightly-doped spaced-apart p-type region to form a heavily-doped p-type regions wherein the fourth dose of dopant has a higher concentration than the second dose of dopant.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate an embodiment of the invention and, together with the description, serve to explain the objects, advantages, and principles of the invention.

In the drawings.

DETAILED DESCRIPTION OF THE PREFERRED EMBODIMENTS

In accordance with the present invention, a high-gain composite pnp BJT is provided in a CMOS device. The composite pnp BJT is comprised of a lateral pnp BJT and a lateral npn BJT, wherein the base of the lateral npn BJT is a shallow p-well. The gain of the composite pnp BJT is the product of the gain of the lateral npn BJT multiplied by the gain of the lateral pnp BJT, and is not influenced by the depth of the shallow p-well.

Figure 1:
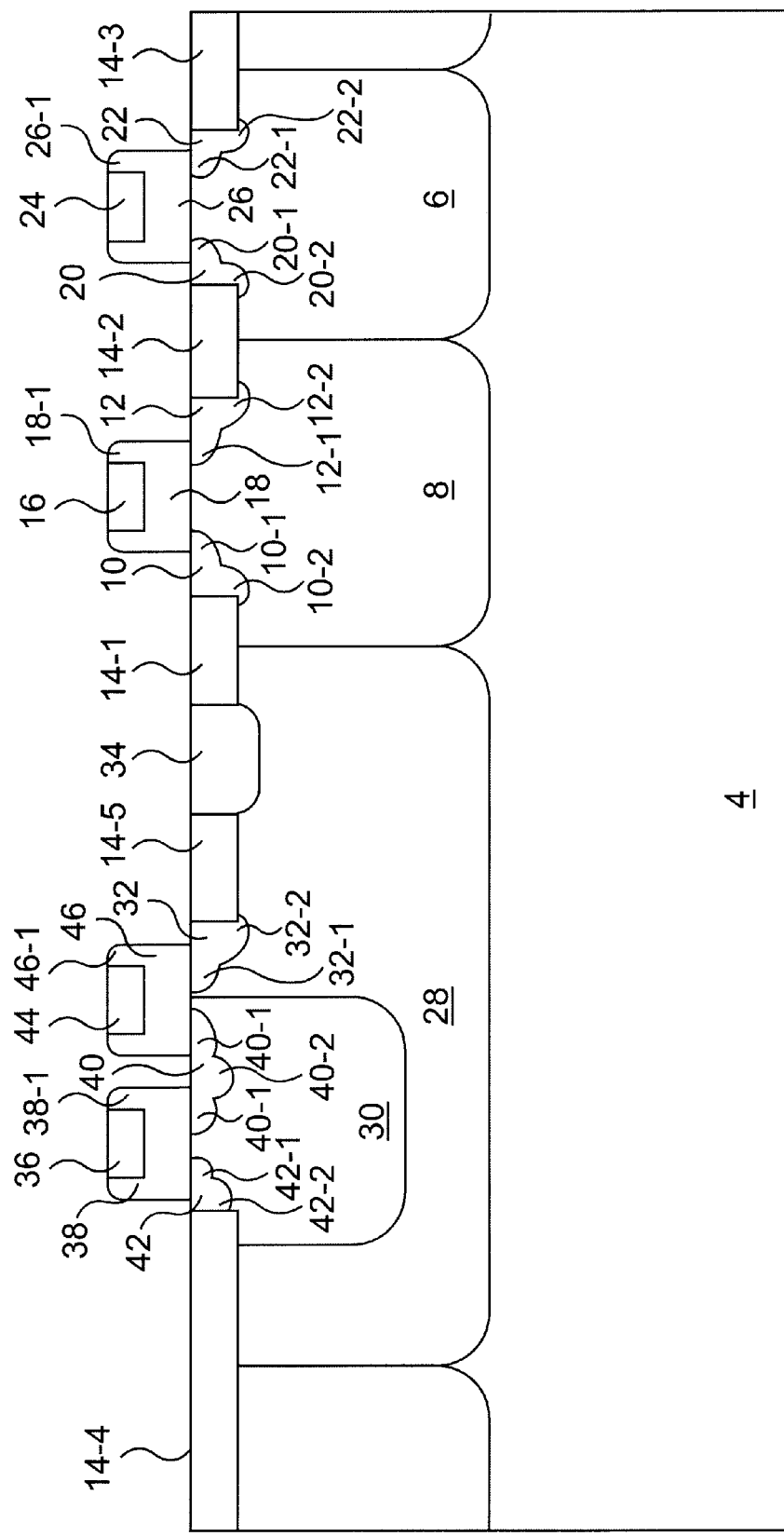
FIG. 1 shows a cross-sectional view of a CMOS device having a composite pnp bipolar junction transistor constructed in accordance with the present invention.

An embodiment of the present invention is shown in FIG. 1, which shows a cross-sectional view of a twin-well CMOS device 2 with a composite pnp BJT. Although only one composite pnp BJT is shown, one of ordinary skill in the art will now understand that more than one such composite pnp BJT may be implemented in a CMOS device.

Referring to FIG. 1, CMOS device 2 includes a p-type semiconductor substrate 4, an n-well region 6 that contains a p-type MOS ("PMOS"), a contiguous p-well region 8 that contains an n-type MOS ("NMOS"), and an n-well region 28 contiguous with p-well region 8. N-well region 28 contains a composite pnp BJT.

N-well region 6 includes spaced-apart p-type regions 20 and 22 that respectively serve as drain and source regions for the PMOS. N-well region 6 includes a channel region (not numbered) between spaced-apart regions 20 and 22, and shallow trench isolation ("STI") structures 14-2 and 14-3 contiguous with spaced-apart regions 20 and 22, respectively. Each STI 14 (i.e., 14-2, 14-3, etc.) may be composed of a suitable dielectric material such as silicon dioxide. Region 20 includes a lightly-doped region 20-1 and a heavily-doped region 20-2 and region 22 likewise includes a lightly-doped region 22-1 and a heavily-doped region 22-2. The PMOS also includes a gate structure including a gate 24 and gate insulator 26 positioned over the channel region.

Contiguous with the PMOS is an NMOS that includes P-well region 8, which includes spaced-apart n-type regions 10 and 12 that respectively serve as drain and source regions for the NMOS. Region 10 includes a lightly-doped region 10-1 and a heavily-doped region 10-2 and region 12 includes a lightly-doped region 12-1 and a heavily-doped region 12-2. P-well region 8 also includes a channel region (not numbered) between spaced-apart regions 10 and 12, and STIs 14-1 and 14-2 contiguous with spaced-apart regions 10 and 12, respectively. The NMOS also includes a gate structure including a gate 16 and gate insulator 18 positioned above the channel region.

Contiguous with the NMOS is a high-gain composite pnp BJT. The composite BJT includes N-well region 28, a lateral pnp BJT, and a lateral npn BJT. Specifically, n-well region 28 includes a shallow p-well region 30, a p-type region 32, an n-type region 34, and STIs 14-4 and 14-5.

Shallow p-well region 30 includes spaced-apart n-type regions 40 and 42 that respectively serve as emitter and collector regions of the lateral npn BJT. Region 40 includes two lightly-doped regions 40-1 and a heavily-doped region 40-2 and region 42 includes a lightly-doped region 42-1 and a heavily-doped region 42-2. Shallow p-well region 30 further includes a channel region (not numbered) between spaced-apart regions 40 and 42. Region 42 is contiguous with STI 14-4. A gate structure including a gate 36 and gate insulator 38 is positioned over the channel region to complete the lateral npn BJT.

The lateral pnp BJT includes spaced-apart regions 32 and 40, and a channel region there between (not numbered). Region 32 is contiguous with STI 14-5. Region 32 includes a lightly-doped region 32-1 and a heavily-doped region 32-2. Region 40 includes a lightly-doped region 40-1 and a heavily-doped region 40-2. A gate structure including a gate 44 and gate insulator 46 is positioned over the channel region to complete the lateral pnp BJT of the present invention.

Figure 2:
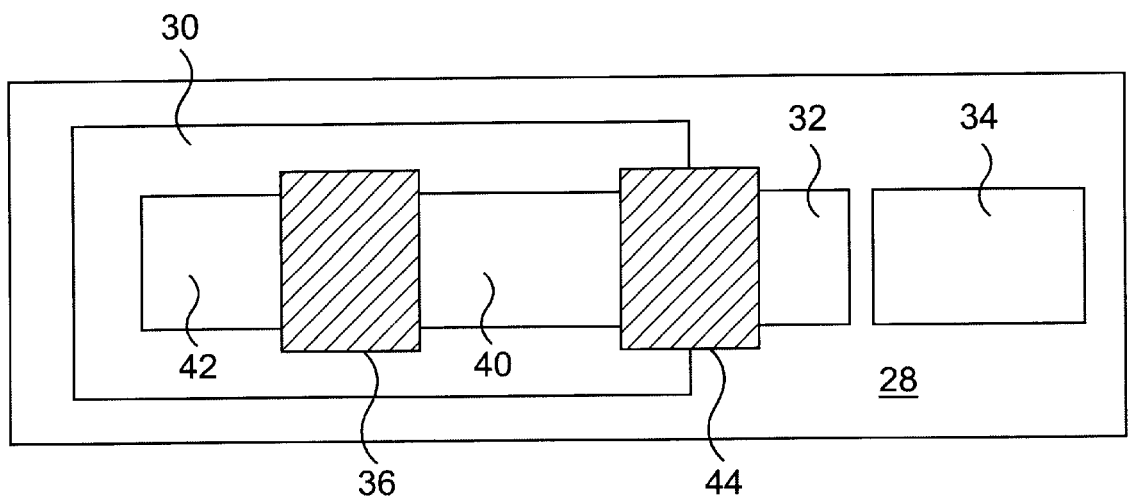
FIG. 2 shows a top view of a layout of a portion of a composite pnp bipolar junction transistor constructed in accordance with the present invention.

FIG. 2 shows the top view of the layout of a part of a composite pnp BJT of the present invention. Referring to FIG. 2, n-well region 28 includes implanted spaced-apart regions 32 and 34, and implanted spaced-apart n-type regions 40 and 42. Gate 36 is disposed over the channel region between spaced-apart n-type regions 40 and 42 and gate 44 is disposed over the channel region between n-type region 40 and p-type region 32.

Figure 3:
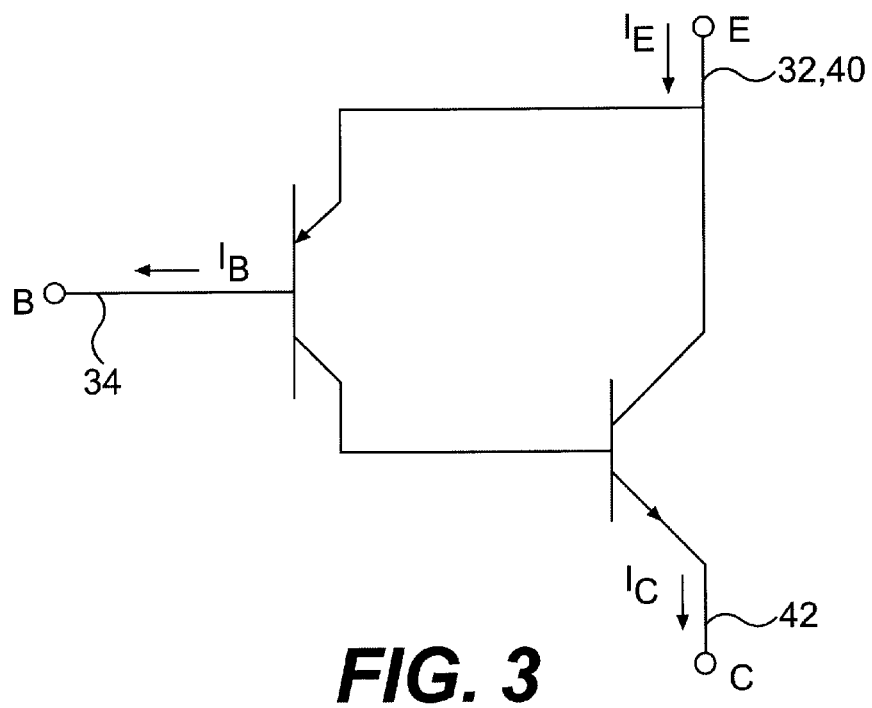
FIG. 3 shows an equivalent circuit of a composite pnp bipolar junction transistor of the present invention.

In operation, the lateral pnp BJT and the lateral npn BJT combine to form the composite high-gain pnp BJT, wherein spaced-apart region 42 acts as the collector, spaced-apart region 34 acts as the base, and spaced-apart regions 32 and 40, in combination, act as the emitter of the composite pnp BJT. An equivalent circuit of the composite pnp BJT is shown in FIG. 3. The arrows in FIG. 3 indicate the direction of current flow for $I_B$, $I_C$ and $I_E$, representing the base, collector, and emitter current, respectively.

The lateral pnp BJT exhibits a gain of $\beta_1$ and the lateral npn BJT exhibits a gain of $\beta_2$. The gain of the composite pnp BJT exhibits a gain $\beta$ equal to the product of $\beta_1$ multiplied by $\beta_2$. In addition, gain $\beta$ is not sensitive to the depth of shallow p-well 30, and may be controlled by the lengths of the gates 36 and 44.

Figure 4A:
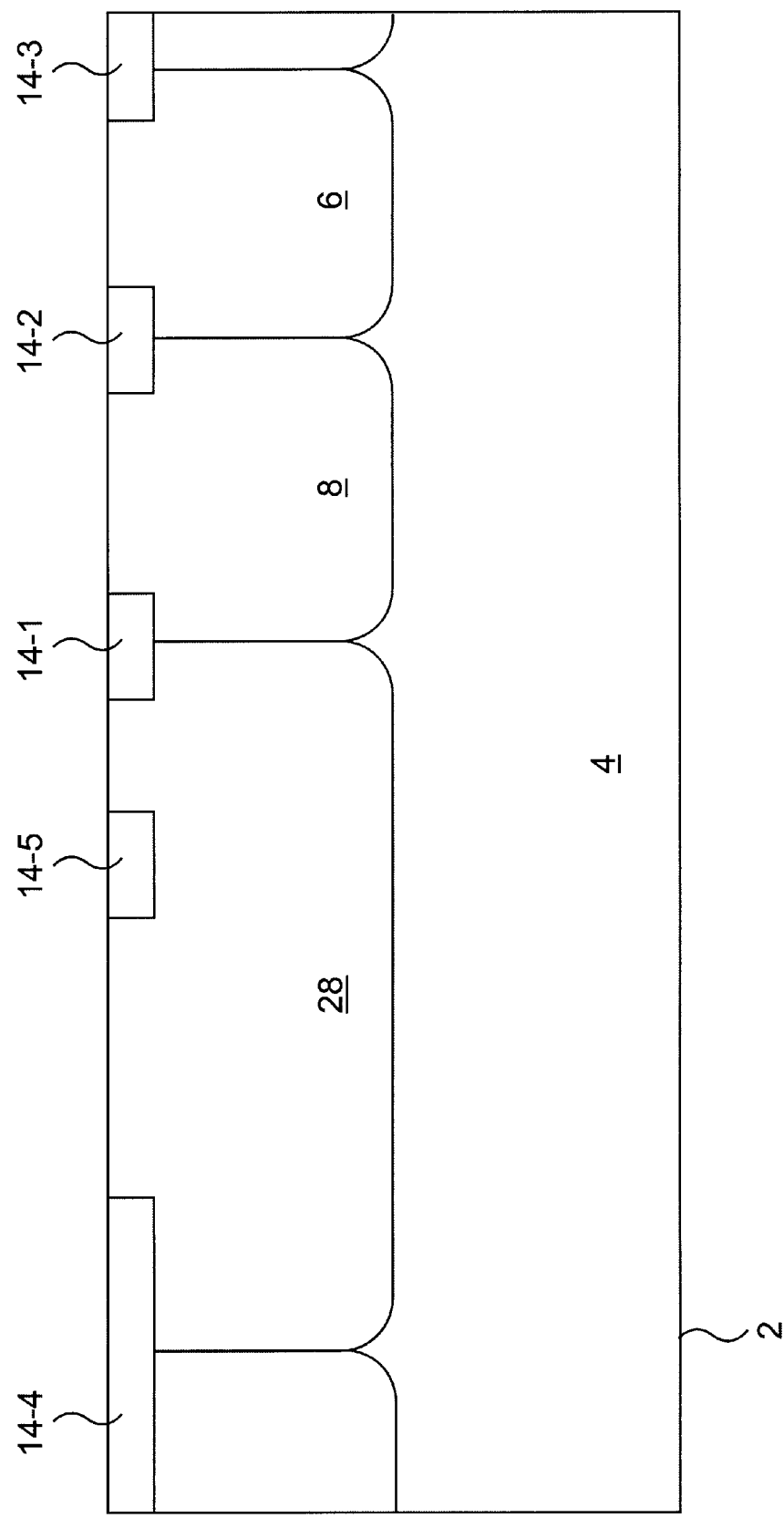
FIGS. 4A-4H show a sequence of cross-sectional views illustrating a method for forming a CMOS device having a composite pnp bipolar junction transistor according to the present invention.

A method in accordance with the present invention is explained with reference to FIGS. 4A–4H. Referring to FIG. 4A, n-well region 6, p-well region 8, n-well region 28 and STIs 14-1, 14-2, 14-3, 14-4 and 14-5 are formed in silicon substrate 4 with a conventional CMOS manufacturing process. For example, n-well regions 6 and 28 may be formed by implanting phosphorus P at a dose of approximately $10^{11}$ to $10^{13}$ per cm$^2$ at an energy of approximately between 80 KeV to 200 KeV. P-well region 8 may be formed by implanting boron B or $BF_2$ at a dose of approximately $10^{11}$ to $10^{13}$ per cm$^2$ at an energy of approximately between 80 KeV to 200 KeV.

Figure 4B:
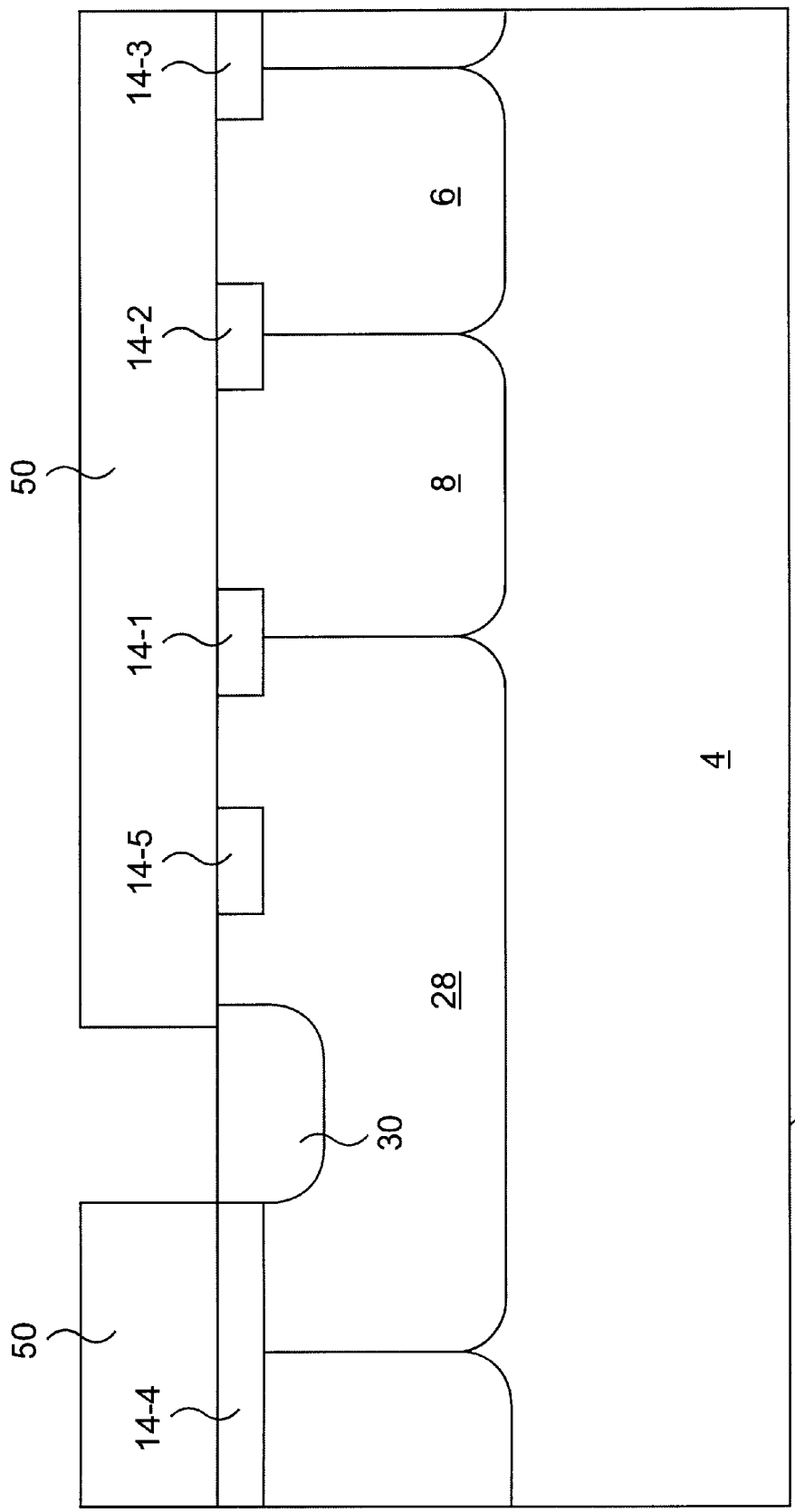

Referring to FIG. 4B, a first photoresist 50 is disposed over substrate 4 and patterned to remove a portion where shallow p-well 30 is to be formed. With photoresist 50 as a mask, a step of ion implantation is performed. Specifically, substrate 4 is doped with $BF_2$ at a dose of approximately $10^{11}$ to $5 \times 10^{13}$ per cm$^2$ at a relatively low energy of approximately between 60 KeV to 120 KeV to form shallow p-well 30. The $BF_2$ ion implantation step preferably takes place after the formation of the STIs to limit dopant diffusion. In a preferred embodiment, shallow p-well 30 extends approximately between 0.1 micron and 0.3 microns underneath STI14-4. Photoresist 50 is then removed.

Figure 4C:
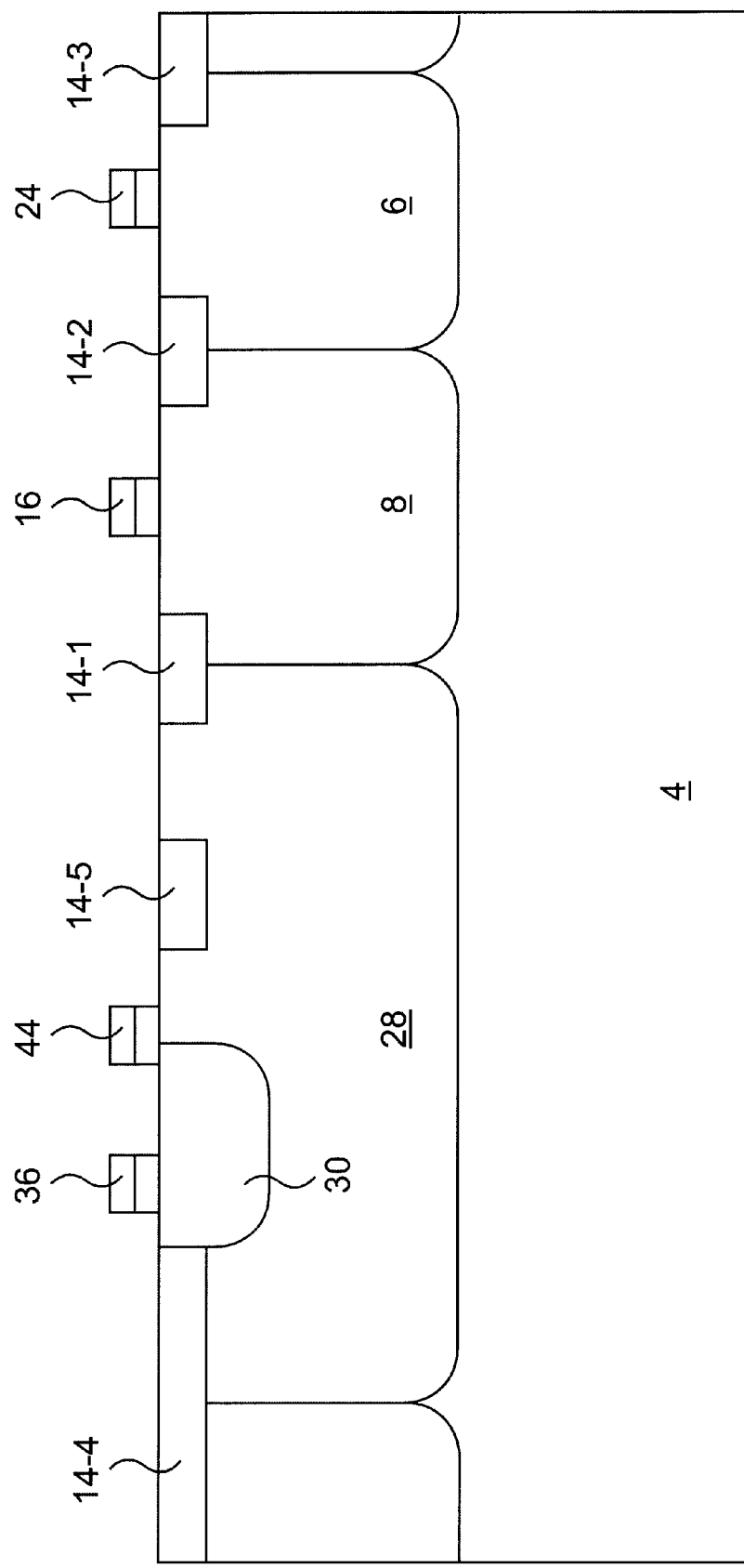

FIG. 4C shows the formation of the gates of the PMOS, NMOS, npn BJT and pnp BJT. Conventional steps may be employed to form the gates as shown in FIG. 1. Specifically, a layer of gate oxide (not numbered) is grown at a temperature between approximately 700° C. and approximately 900°

C. A poly silicon layer is deposited over the gate oxide layer. A photoresist is the deposited over the polysilicon layer, patterned to form open areas. The stacked structure of the polysilicon and gate oxide layers is then etched. After the photoresist is removed, gates 36, 44, 16 and 24 and the gate oxide disposed directly beneath the gates remain. In a preferred embodiment, the overlap between gate 44 and shallow p-well 30 is approximately between 0.1 micron and 1.0 microns.

Figure 4D:
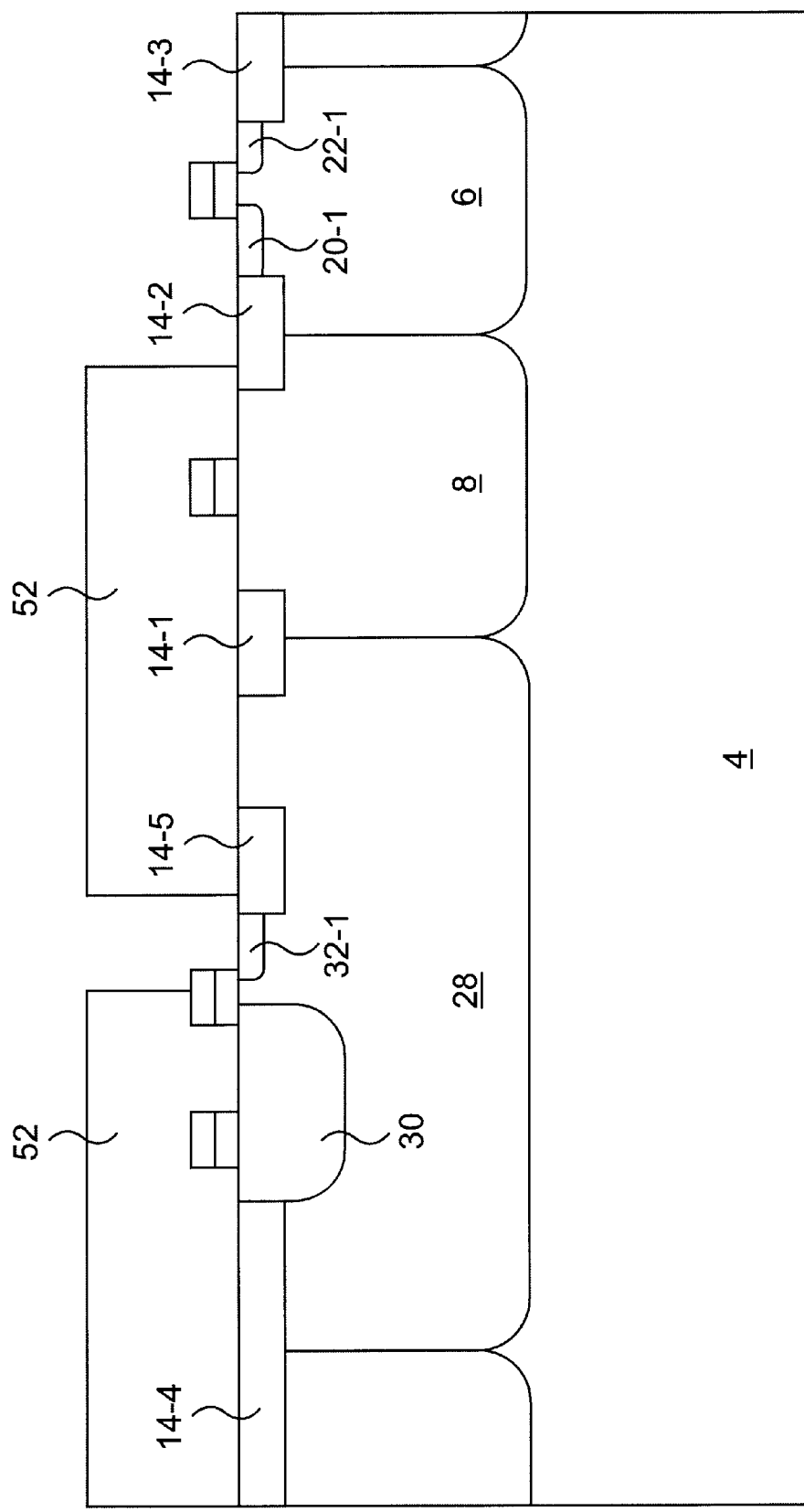

Lightly-doped regions 32-1, 22-1 and 20-1 of p-type regions 32, 22 and 20, respectively, are then formed. Referring to FIG. 4D, a second photoresist 52 is deposited over substrate 4 and patterned to form open areas directly above regions 32, 22 and 20. With photoresist 52 as a mask, a second step of ion implantation is performed. Regions 32, 22 and 20 are doped with B or $BF_2$ at a dose of approximately $10^{12}$ to $10^{14}$ per $cm^2$ at an energy of approximately between 20 KeV to 60 KeV.

Figure 4E:
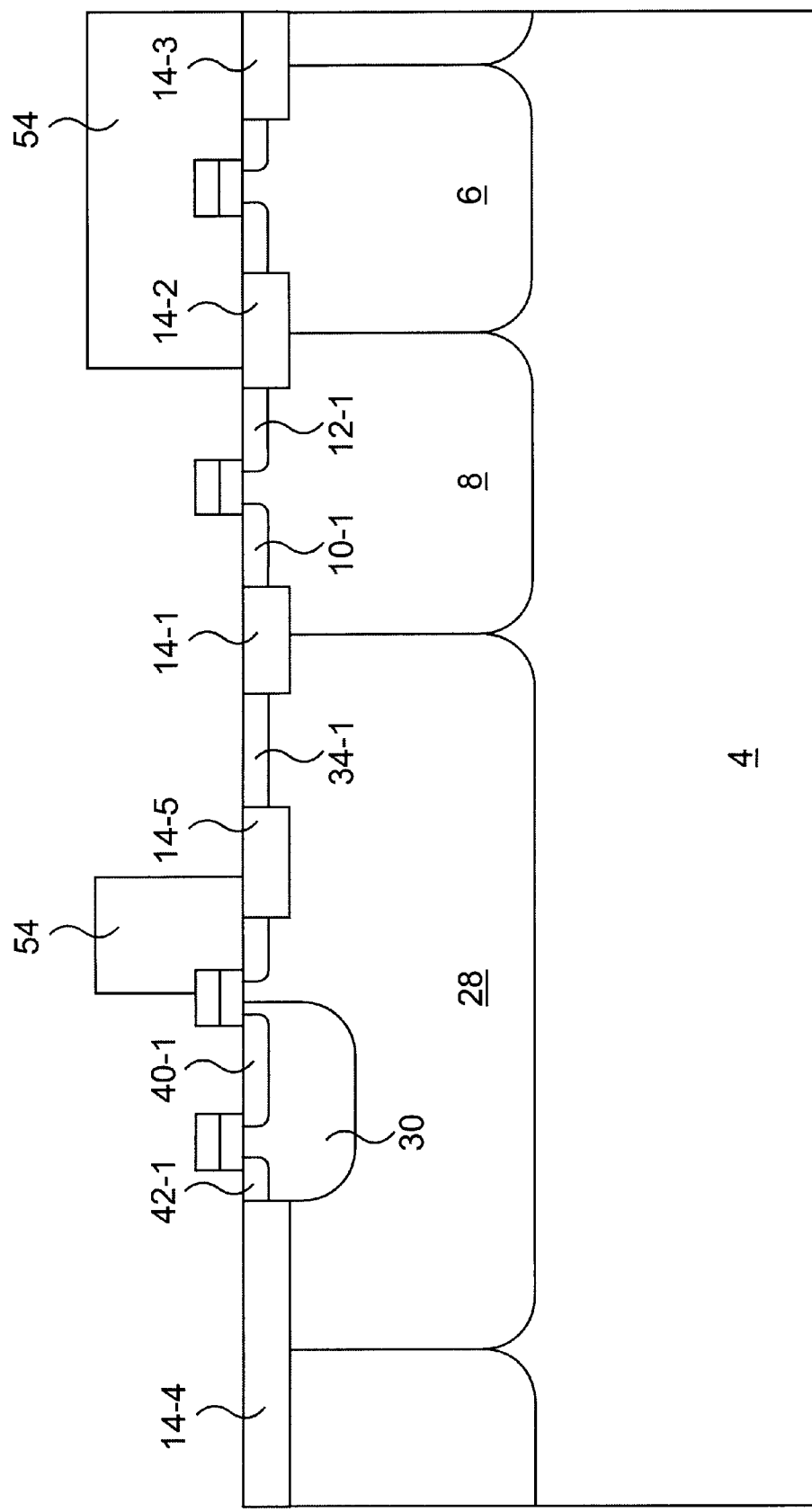

After photoresist 52 is removed, the n-type lightly doped regions are then formed. Referring to FIG. 4E, a third photoresist 54 is disposed over substrate 4 and patterned to form open areas as shown. With photoresist 54 as a mask, a third step of ion implantation is performed. The exposed areas of substrate 4 are doped with phosphorus P or arsenic As at a dose of approximately $10^{12}$ to $2\times10^{14}$ per $cm^2$ at an energy of approximately between 20 KeV to 80 KeV, forming n-type region 34-1 and n-type lightly doped regions 42-1, 40-1, 10-1, 12-1 and 34-1 of spaced-apart regions 42, 40, 10 and 12, respectively. Photoresist 54 is then removed.

Figure 4F:
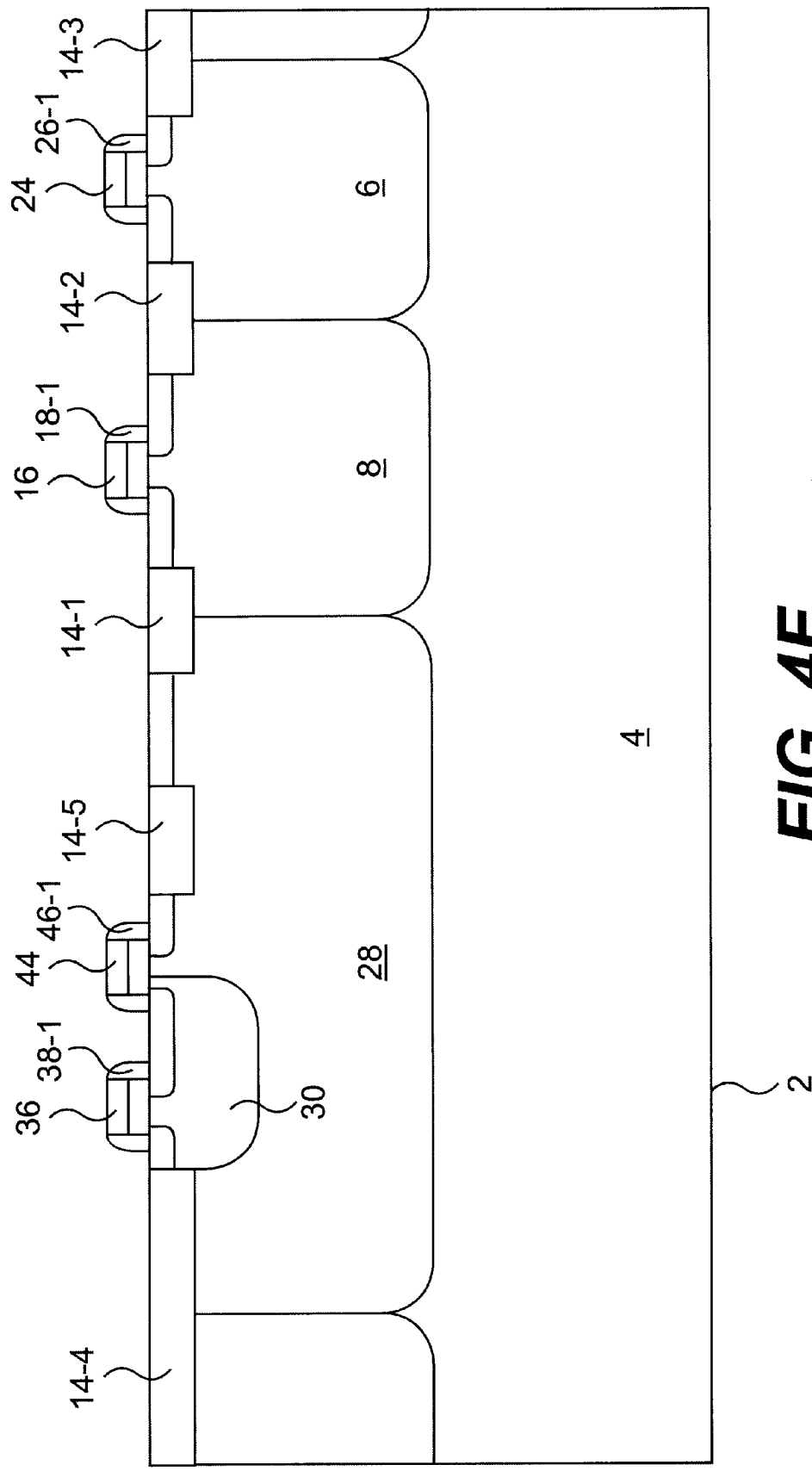

Conventional steps may be used to form spacer oxides 38-1, 46-1, 18-1 and 26-1 surrounding gates 36, 44, 16 and 24, respectively, as shown in FIG. 4F. In a preferred embodiment, spacer oxides 38-1, 46-1, 18-1 and 26-1 are composed of undoped tetraethyl orthosilicate ("TEOS"), and the width of the spacer oxides is between approximately 0.05 microns and 0.3 microns.

Figure 4G:
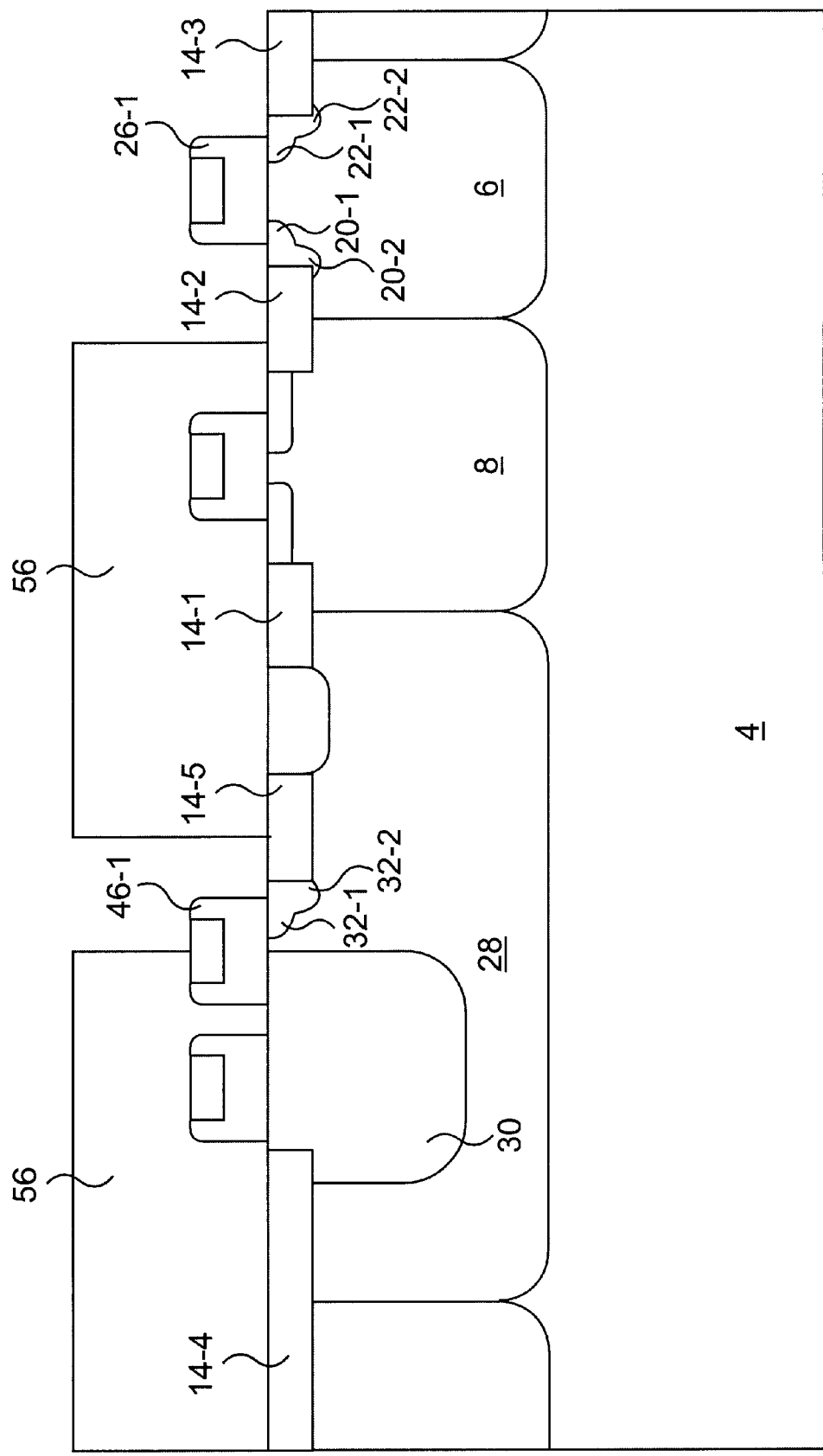

Heavily doped p-type regions 32-2, 20-2 and 22-2 of regions 32, 20 and 22, respectively, are formed next. Referring to FIG. 4G, a fourth photoresist 56 is deposited over substrate 4 and patterned to form open areas above regions 32, 20 and 22. With photoresist 56 and spacer oxides 46-1 and 26-1 as a mask, a fourth ion implantation step is performed. Regions 32, 22 and 20 are doped with B or $BF_2$ at a dose of approximately $5\times10^{14}$ to $5\times10^{15}$ per $cm^2$ at an energy of approximately between 20 KeV to 80 KeV, thereby forming heavily doped regions 32-2, 22-2 and 20-2. As a result, spaced-apart region 32 includes lightly-doped region 32-1 and heavily-doped region 32-2; spaced-apart region 20 includes lightly-doped region 20-1 and heavily-doped region 20-2; and spaced-apart region 22 includes lightly-doped region 22-1 and heavily-doped region 22-2. Photoresist 56 is then removed.

Figure 4H:
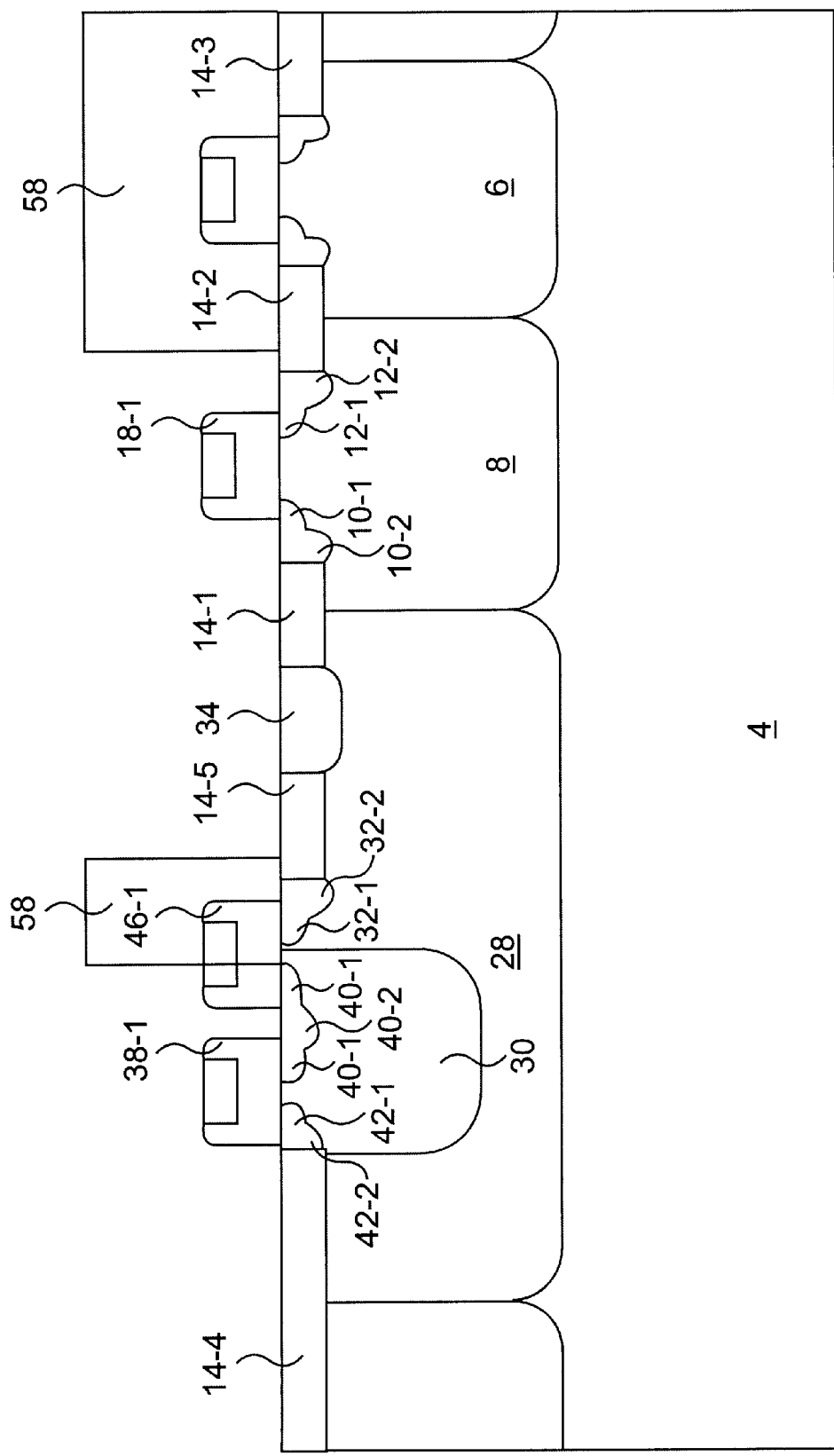

Heavily doped n-type regions 42-2, 40-2, 10-2 and 12-2 of regions 42, 40, 10 and 12, and region 34 are formed. Referring to FIG. 4H, a fifth photoresist 58 is deposited over substrate 4 and patterned to form open areas above regions 40, 42, 34, 10 and 12. With photoresist 58 and spacer oxides 38-1, 46-1 and 18-1 as a mask, a fifth ion implantation step is performed. Regions 40, 42, 34, 10 and 12 are doped with As at a dose of approximately $5\times10^{14}$ to $5\times10^{15}$ per $cm^2$ at an energy of approximately between 20 KeV to 100 KeV, thereby forming heavily doped regions 40-2, 42-2, 10-2 and 12-2, and region 34. As a result, spaced-apart region 40 includes lightly-doped region 40-1 and heavily-doped region 40-2; spaced-apart region 42 includes lightly-doped region 42-1 and heavily-doped region 42-2; spaced-apart region 10 includes lightly-doped region 10-1 and heavily-doped region 10-2; and spaced-apart region 12 includes lightly-doped region 12-1 and heavily-doped region 12-2. Photoresist 58 is then removed.

The method of the present invention continues with known steps of forming inter-layer dielectrics, forming contacts and metalization.

It will also be apparent to those skilled in the art that various modifications and variations can be made in the disclosed product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An integrated circuit device, comprising:
   a semiconductor substrate;
   a first n-well in said substrate;
   a first p-well contiguous with said first n-well in said substrate;
   a second n-well contiguous with said first p-well including
   a second p-well having a first n-type region and a second n-type region, said first and second n-type regions respectively defining emitter and collector regions of a first BJT, and
   a first p-type region spaced apart from said second p-well, said first p-type region and said second p-well respectively defining emitter and collector regions of a second BJT.

2. The integrated circuit device as claimed in claim 1, further comprising a third n-type region spaced apart from said first p-type region.

3. The integrated circuit device as claimed in claim 1, wherein said first n-type region is a collector of a composite pnp BJT.

4. The integrated circuit device as claimed in claim 1, wherein said second n-type region and said first p-type region comprise emitter of a composite pnp BJT.

5. The integrated circuit device as claimed in claim 1, wherein said third n-type region is a base of a composite pnp BJT.

6. The integrated circuit device as claimed in claim 1, wherein said first p-type region and said third n-type region are separated by a shallow trench isolation.

7. The integrated circuit device as claimed in claim 1, wherein said second p-well comprises an npn BJT.

8. The integrated circuit device as claimed in claim 1, wherein said second p-well, said first p-type region, and said third n-type region comprise a pnp BJT.

9. The integrated circuit device as claimed in claim 1, wherein said second p-well having said first n-type region and said second n-type region comprises an npn BJT having a first gain, and said second p-well, said first p-type region, and said third n-type region comprise a pnp BJT having a second gain, and wherein said npn BJT and said pnp BJT together form a composite pnp BJT having a combined gain equal to a product of said first gain multiplied by said second gain.

10. The integrated circuit device as claimed in claim 9, wherein said combined gain may be controlled by the gate lengths of said npn BJT and said pnp BJT.

11. An integrated circuit device, comprising:
a semiconductor substrate;
an NMOS formed in said substrate;
a PMOS contiguous with said NMOS and formed in said substrate; and
a composite pnp bipolar junction transistor contiguous with said NMOS and formed in said substrate, said composite pnp bipolar junction transistor including:
a lateral npn bipolar junction transistor having first and second spaced-apart n-type regions, and
a lateral pnp bipolar junction transistor including said second spaced-apart n-type region, a first spaced-apart p-type region and a third n-type region, wherein said first p-type spaced-apart region and said third n-type region are separated by a shallow trench isolation.

12. The integrated circuit device as claimed in claim 11, wherein said first n-type spaced-apart region is a collector of said composite pnp bipolar junction transistor.

13. The integrated circuit device as claimed in claim 11, wherein said second n-type spaced-apart region and said first p-type spaced-apart region comprise an emitter of said composite pnp bipolar junction transistor.

14. The integrated circuit device as claimed in claim 11, wherein said third n-type region is a base of said composite pnp bipolar junction transistor.

15. The integrated circuit device as claimed in claim 11, wherein a gain of said composite pnp bipolar junction transistor equals a gain of said lateral npn bipolar junction transistor multiplied by a gain of said lateral pnp bipolar junction transistor.

* * * * *